United States Patent [19]
Carlson et al.

[11] Patent Number: 5,421,957
[45] Date of Patent: Jun. 6, 1995

[54] LOW TEMPERATURE ETCHING IN COLD-WALL CVD SYSTEMS

[75] Inventors: David K. Carlson, Santa Clara; H. Peter W. Hey, San Jose; James C. Hann, Santa Clara, all of Calif.

[73] Assignee: Applied Materials, Inc., Santa Clara, Calif.

[21] Appl. No.: 100,582

[22] Filed: Jul. 30, 1993

[51] Int. Cl.$^6$ .............................................. B44C 1/22
[52] U.S. Cl. ......................... 216/58; 216/67; 134/1.1
[58] Field of Search ............... 156/646, 345, 643; 118/728, 729

[56] References Cited

U.S. PATENT DOCUMENTS

| | | | |
|---|---|---|---|
| 4,820,377 | 4/1989 | Davis | 156/643 |
| 5,022,961 | 6/1991 | Izumi | 156/646 |
| 5,039,388 | 6/1991 | Miyashita | 204/192.32 |
| 5,043,299 | 8/1991 | Chang | 437/192 |
| 5,259,923 | 11/1993 | Hori | 156/643 |

FOREIGN PATENT DOCUMENTS 2183204  5/1989  United Kingdom .

OTHER PUBLICATIONS

Wolf, "Silicon Processing" vol. 1, Lattice Press, 1986, pp. 166-167.

*Primary Examiner*—R. Bruce Breneman
*Assistant Examiner*—Joni Chang
*Attorney, Agent, or Firm*—Randy W. Tung; Peter J. Sgarbossa

[57] ABSTRACT

An improved method of etching or cleaning a cold-wall chemical vapor deposition chamber that is substantially moisture-free at a low chamber temperature and a low chamber pressure while maintaining a satisfactory etch rate by using at least one etchant gas selected from the group consisting of nitrogen trifluoride, chlorine trifluoride, sulfur hexafluoride, carbon tetrafluoride or the like and mixtures thereof.

22 Claims, 2 Drawing Sheets

LOW TEMPERATURE ETCHING IN COLD-WALL CVD SYSTEMS

FIELD OF THE INVENTION

The present invention generally relates to an improved method of etching a cold wall chemical vapor deposition (hereinafter CVD) chamber and more particularly, relates to an improved method of in-situ cleaning a substantially moisture-free cold-wall CVD chamber by a low temperature and low pressure etching process utilizing a reactive gas of nitrogen trifluoride, chlorine trifluoride, sulfur hexafluoride, carbon tetrafluoride or the like, or mixtures thereof.

BACKGROUND OF THE INVENTION

Recent technological advances in the increasing miniaturization of electronic circuits is made possible by advances in semiconductor processing. Certain advanced processing techniques require exposing a semiconductor's structure to a reactant gas under carefully controlled conditions of elevated temperatures, sub-ambient pressures, and uniform reactant gas flow. The examples of such processes include low-pressure CVD, reduced-pressure CVD, and selective epitaxial deposition.

Cold wall CVD systems have been used in recent years for the deposition of various semiconductor materials on silicon wafers. One of such low-pressure CVD system is a single-wafer cold-wall CVD system utilizing a high-throughput CVD chamber. More stringent standards of film quality and increasing wafer sizes utilized in recent years are diverting the equipment technology away from very large batch systems toward single-wafer processing. Such single-wafer processing equipment are being designed as a multichamber clustered integrated processing system incorporating the use of load-lock systems wherein a wafer can be transported from one single-wafer process chamber to another through a central load-lock system without breaking vacuum.

A typical single-wafer cold-wall CVD chamber is radiantly heated to enable precise temperature control in the range from about 500° C. to about 1,000° C. The wafer is mounted on a susceptor, which is a silicon carbide coated graphite disc, to receive uniform deposition of materials on the wafer surface. The susceptor may be rotated by a motor during deposition to further improve the uniformity of the coating. This type of thermal reactor for semiconductor processing provides for high-throughput, flexible thermal control, and process uniformity for large wafers at ambient and reduced pressures.

Reactant gases enter the CVD chamber and produce films of various electronic materials on the surface of a wafer for various purposes such as for metalization layers, for dielectric layers, for insulation layers, etc. The various electronic materials deposited include spitaxial silicon, polysilicon, silicon nitride, silicon oxide, and refractory metals such as titanium, tungsten and their silicides. In these film deposition processes, most of the material from the reactive gases is deposited on the wafer surface. However, it is inevitable that a small amount of the material is deposited on heated surfaces inside the chamber other than that of the wafer. This also occurs in a cold-wall CVD system in which the chamber wall is kept cool by the circulation of cooling air outside the chamber to avoid deposition of materials on the wall.

It is therefore necessary after a certain number of deposition processes to clean the heated surface inside the chamber of deposited materials. These heated surfaces include the exposed surface of the susceptor, the surface of the preheat ring, and any other heated surfaces inside the chamber.

Various in-situ cleaning methods have been developed for cleaning the chamber surface of a CVD system. These in-situ cleaning methods present an improvement over the conventional wet chemical cleaning method in which the components need to be disassembled and cleaned in strong acids resulting in great expenses of labor and downtime.

Various in-situ chamber cleaning methods have been proposed by others. For instance, conventional silicon and polysilicon processes use hydrogen chloride gas (HCl) at high temperatures, i.e., in the range between 1,100° C. to 1,200° C., for chamber cleaning. Others have cleaned plasma chamber at low temperatures, i.e., less than 400° C. with various chemistries. One of the cleaning gases used in these cleaning methods has been nitrogen trifluoride ($NF_3$).

Nitrogen trifluoride when used at high temperatures or with a plasma is extremely aggressive and etches almost all materials in the chamber including quartz, silicon carbide, and all metals. Nitrogen trifluoride has also been used in hot-wall CVD systems without a plasma. However, the quartz chamber walls can be seriously etched and any moisture will significantly change the etching characteristics due to the formation of the extremely reactive hydrogen fluoride (HF).

A prior-art method of using nitrogen trifluoride as an in-situ cleaning agent for cleaning CVD hardware is disclosed in published UK Patent Application GB2183204A. Nitrogen trifluoride was introduced into a heated CVD reactor under a partial pressure for a period of time sufficient to clean the deposited films of material. The temperature of the heated chamber for cleaning was between 380° C. and 500° C. and the pressure of pure nitrogen trifluoride gas used was between 200 and 600 Torr. The publication suggested that, since nitrogen trifluoride is highly toxic and explosive under pressure, it is desirable to use lower pressures of nitrogen trifluoride for health, safety and environmental reasons even though only unacceptably low etch rates can be realized at such low chamber pressures. It is noted that the temperature range disclosed by the publication is very flow, i.e. 380° C.~500° C. This is necessitated by the fact that moisture was present in the chamber which contributed to the formation of hydrogen fluoride. The lower temperature range was necessary to contain the reactivity of hydrogen fluoride in order to reduce the etching damage to the chamber hardware.

It is therefore an object of the present invention to provide a method of in-situ cleaning a cold-wall CVD chamber by a reactive gas that does not have the shortcomings of conventional wet chemical cleaning methods.

It is another object of the present invention to provide a method of in-situ cleaning a cold-wall CVD chamber with a reactive gas at a sufficiently low pressure while maintaining a satisfactory etch rate.

It is a further object of the present invention to provide a method of in-situ cleaning a cold-wall CVD chamber with a reactive gas by providing a substantially moisture-free chamber environment such that a reactive gas at a sufficiently low pressure may be used while maintaining a satisfactory etch rate.

It is another further object of the present invention to provide an etchant gas system for in-situ cleaning of a cold-wall CVD chamber which can be used at low chamber pressures and low chamber temperatures in a substantially moisture-free environment to achieve a high etch rate.

SUMMARY OF THE INVENTION

In accordance with the present invention, an improved method of in-situ cleaning a cold-wall CVD chamber by using a reactive or etchant gas is provided.

In the preferred embodiment, the improved method is provided by utilizing an etchant gas of nitrogen trifluoride for the in-situ cleaning of a cold-wall CVD chamber that has a substantially moisture-free environment. Based on the synergistic combination of a moisture-free environment and a suitable cleaning temperature in the chamber, only a very low pressure of etchant gas is necessary to achieve a satisfactory etch rate for the cleaning process.

In an alternate embodiment, the improved cleaning method is provided by utilizing an etchant gas of chlorine trifluoride ($ClF_3$), sulfur hexafluoride ($SF_6$) or carbon tetrafluoride ($CF_4$) in a substantially moisture-free CVD chamber heated to a predetermined temperature. The etchant gas chlorine trifluoride is more effective than nitrogen trifluoride, even when used at a lower chamber temperature and at a lower chamber pressure.

In another alternate embodiment, mixtures of etchant gases of nitrogen trifluoride and chlorine trifluoride are used in a substantially moisture-free CVD chamber for cleaning. The mixtures of the etchant gases also produce satisfactory results in achieving its cleaning objective at a satisfactory etch rate. These mixtures of etchant gases are preferred in certain cleaning procedures since the mixtures enable one to customize an etching temperature and an etching pressure for a specific semiconductor material.

The present invention is further directed to an etchant gas system of nitrogen trifluoride, chlorine trifluoride, sulfur hexafluoride, carbon tetrafluoride or the like, or mixtures thereof for use in a substantially moisture-free CVD chamber heated to a temperature no less than 500° C. for effective cleaning of the chamber hardware and components.

BRIEF DESCRIPTION OF THE DRAWINGS

Other objects, features and advantages of the present invention will become apparent upon consideration of the specification and the appended drawings, in which.

DETAILED DESCRIPTION OF THE EMBODIMENTS

The present invention discloses an improved method of utilizing a reactive etchant gas for the in-situ cleaning of a cold-wall CVD chamber which has a substantially moisture-free environment.

Figure 1:
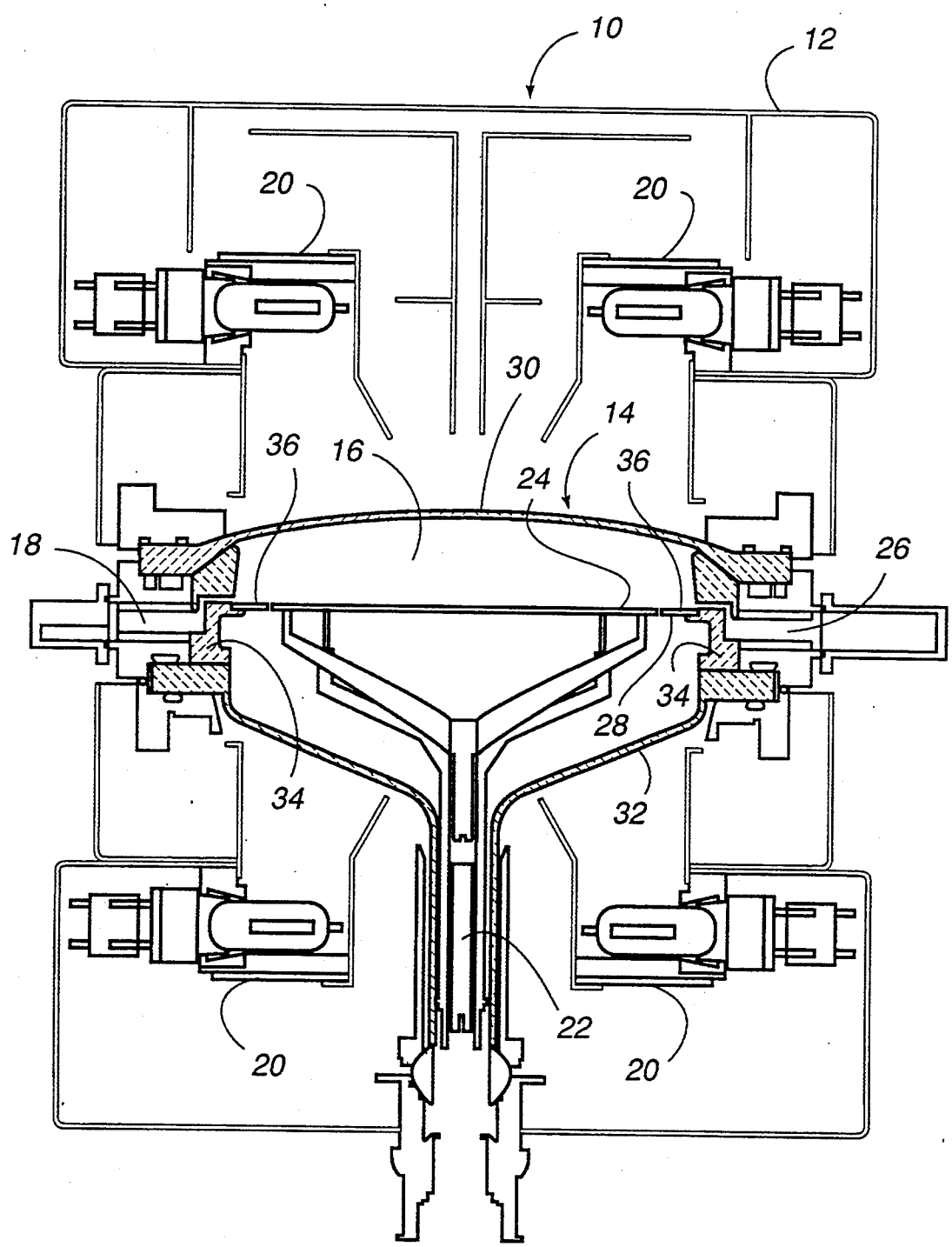
FIG. 1 is a cross-sectional view of a typical single wafer, cold-wall CVD apparatus.

Referring initially to FIG. 1, a cross-sectional view of a typical single-wafer, cold-wall CVD apparatus is shown. The figure shows a thermal reactor 10 for processing semiconductor wafers has a housing 12, a double-dome reactor vessel 14 principally made of quartz that defines a reactor chamber 16, a gas inlet manifold 18, a gas exhaust manifold 26, a radiant heating system 20, a drive assembly 22, a susceptor 24, and a preheat ring 28. The illustrated reactor 10 does not use a plasma for either deposition or cleaning. The double-dome reactor vessel 14 includes a top dome 30 and a bottom dome 32, of quartz which are cooled by circulating cooling air such that a cold wall, i.e. at 100°~200° C., is maintained. The drive assembly 22 is coupled to a motor (not shown) to rotate the susceptor 24 during the deposition process to enhance coating uniformity for the wafer supported on top of the susceptor 24. The cold wall is an important feature of the present single-wafer system since it prevents the deposition of semiconductor materials on the wall during chamber cleaning.

After repeated deposition processes are conducted in chamber 16, the top surfaces of the circumferential edge of the susceptor 24 and the preheat ring 28 are covered with a film of the deposited material. The susceptor 24 is usually constructed of a thin plate for low thermal mass and a surrounding rim for rigidity. The diameter of a susceptor in a typical reaction vessel is approximately 9 inches (240 mm) while the diameters of wafers being coated are normally 6 or 8 inches (150 or 200 nun). A circumferential area is therefore exposed to the depositing semiconductor material. The susceptor 24 is typically made of graphite and coated with a silicon carbide coating such that it can be heated up to the deposition temperature without significant contamination.

The preheat ring 28 substantially seals the gap between the susceptor and the quartz liner 34 of the reactor vessel 14 to control the heat loss from the edge of the susceptor. The preheat ring 28 is made of graphite material coated with silicon carbide for absorbing radiant heat from heaters 20. A quartz preheat ring can also be used. The top surface 36 of the preheat ring 28 is exposed to the depositing material and therefore accumulates a film of such material due to the fact that the ring is heated to the deposition temperature.

It has been observed that after a sufficient number of deposition processes, i.e. about 25~75 processes for most materials, a film of sufficient thickness in the range between 1 to 5 micrometers builds up on the susceptor and the preheat ring. These unwanted films, if not cleaned or etched away, can impede the heating efficiency of the graphite parts. These unwanted films may also become sources of contamination and disrupt the process integrity.

By using the present improved method of in-situ cleaning, films of various materials such as epitaxial silicon, polysilicon, silicon nitride, silicon oxide, refractory metals of titanium, tungsten and their silicides can be effectively etched away.

It was discovered that an effective way to overcome the shortcomings of the prior art method is to make the reactor chamber substantially moisture-free. By substantially moisture-free, is meant an environment that has a moisture content of less than 10 parts per million (PPM) by volume. Although an environment that has a moisture content of less than 2 PPM by volume is more preferred.

The moisture content of a reactor chamber can be measured by a typical residual gas analyzer technique used for vacuum systems. One of such analyzer utilized in the present work is Inficon Quadrex 200, Model

901-002-G1 which is manufactured by the Leybold Inficon Co. of East Syracuse, N.Y.

ever, other inert gases such as helium, argon or the like can also be used.

TABLE I

| Test # | T (°C.) | P (Torr) | Time (Min) | Flow Rate (sccm) NF$_3$/N$_2$ | Vol % NF$_3$ | Etch Rate (Å/Min) | | |
|---|---|---|---|---|---|---|---|---|
| | | | | | | Nitride | Oxide | Poly |
| 1 | 650 | 20 | 1 | 100/1,000 | 10 | 7 | .7 | 12 |
| 2 | 650 | 20 | 1 | 200/1,000 | 20 | 22 | 1 | 2 |
| 3 | 650 | 100 | 1 | 100/1,000 | 10 | 148 | 92 | 203 |
| 4 | 650 | 100 | 1 | 200/1,000 | 20 | 282 | 148 | 296 |
| 5 | 700 | 20 | 1 | 100/1,000 | 10 | 48 | 19 | 20 |
| 6 | 700 | 100 | 1 | 100/1,000 | 10 | 556 | 387 | 633 |
| 7 | 700 | 100 | 0.5 | 150/1,000 | 15 | 1174 | 714 | 826 |
| 8 | 700 | 100 | 0.5 | 200/1,000 | 20 | 1178 | 888 | 936 |
| 9 | 725 | 100 | 0.5 | 100/1,000 | 10 | 1092 | 600 | 1058 |
| 10 | 750 | 12 | 1 | 50/10,000 | .5 | 8 | 1 | 58 |
| 11 | 750 | 20 | 1 | 50/10,000 | .5 | 43 | 14 | 2 |
| 12 | 750 | 20 | 1 | 50/5,000 | 1 | 94 | 10 | 109 |
| 13 | 750 | 20 | 1 | 100/5,000 | 2 | 28 | 24 | 35 |
| 14 | 750 | 20 | 1 | 100/1,000 | 10 | 342 | 72 | 305 |
| 15 | 750 | 100 | 1 | 50/10,000 | .5 | 309 | 160 | 389 |
| 16 | 750 | 100 | 0.5 | 100/1,000 | 10 | 1714 | 1312 | 1808 |
| 17 | 750 | 100 | 0.25 | 150/1,000 | 15 | 2440 | 1984 | 2788 |
| 18 | 750 | 100 | 0.25 | 200/1,000 | 20 | 3100 | 2332 | 3376 |
| 19 | 775 | 100 | 0.5 | 100/1,000 | 10 | 2564 | 1974 | 2682 |

A substantially moisture-free environment is achievable in a reactor chamber equipped with a load-lock transfer system. In such a system, a wafer can be transported from one single-wafer process chamber or module to another through a central load-lock system without breaking vacuum. One such system for CVD deposition is supplied by the Applied Materials Corporation in Santa Clara, California under the trademark of Centura® HT Poly.

A substantially moisture-free environment minimizes the possibility of any formation of hydrogen fluoride which is extremely reactive with quartz components used in the reactor chamber. Its reactivity is higher at higher temperatures. It has been observed that at a moisture content of 10 PPM and at a chamber temperature of 500° C., the quartz wall of a CVD chamber is severely etched.

The novel method of in-situ cleaning a CVD chamber achieves a synergistic result when carried out in a substantially moisture-free environment and at a suitable reaction temperature which is higher than that disclosed by prior art. The synergism achieved by these unique processing conditions enables one to utilize reactive gases at very low pressure while maintaining a satisfactory etch rate. The resulting low pressure of the reactive gases used overcomes the shortcomings of the prior-art method. The prior art discloses that in order to maintain an acceptable etch rate, high gas pressure must be used which causes health, safety and environmental problems. Even at such high gas pressures, the etch rate achieved by the prior-art method is lower than that achieved by the present invention.

A series of etch tests were conducted on films of silicon nitride, silicon oxide, and polysilicon by using nitrogen trifluoride, chlorine trifluoride, sulfur hexafluoride and carbon tetrafluoride gases.

Table I shows test results obtained by using nitrogen trifluoride at various chamber temperatures and various chamber pressures. The moisture content of the chamber in all tests is below 1 PPM. It should be noted that the chamber temperature indicated is the temperature measured at the surface of a susceptor. An inert gas of nitrogen was used in these tests as a carrier gas. However, other inert gases such as helium, argon or the like can also be used.

The test results in Table I indicate that nitrogen trifluoride is an effective etchant gas for cleaning cold-wall CVD chambers even at a low temperature of 650° C. and a low pressure of 12 Torr. The required cleaning time at various temperatures and pressures is in the range between 0.25 minutes to 1 minute. The tests were conducted at various volumetric flow rate ratios between the etchant gas NF$_3$ and the carrier gas N$_2$. Higher temperatures than 775° C. and higher pressures than 100 Torr may also be used to achieve a desirable etch rate.

Tests #1 through #4 were conducted at a chamber temperature of 650° C. and at two different chamber pressures of 20 and 100 Torr for a cleaning time of 1 minute. It is seen that, when the flow rate of NF$_3$ is increased such that the total volume percent of NF$_3$ reaches 20%, the etch rates, in most cases, also increase. Even higher flow rates of NF$_3$ have been used to obtain total volume percent of NF$_3$ higher tELan 20% to achieve equally satisfactory results.

Tests #5 through #8 were conducted at a chamber temperature of 700° C. and at two chamber pressures of 20 and 100 Torr for a cleaning time of 1 and 0.5 minutes, respectively. It is seen that at the same temperature, time period and flow rate ratio, increasing the chamber pressure from 20 to 100 Torr (Test #5 and Test #6), resulted in a drastic increase in etch rates for all three films. Increasing the flow rate ratio alone, i.e. from 15 volume percent NF$_3$ (Test #7) to 20 volume percent NF$_3$ (Test #8), only a minimal effect on the etch rate for all three deposited films was observed.

Test #9 was conducted at 725° C. and 100 Torr for 0.5 minute. The etch rates obtained on the films were similar to that obtained in Test #7 indicating that the effect of increasing the temperature by 25° C. is approximately offset by the reduction in volume percent of NF$_3$ by 5%.

Tests #10 through #18 were conducted at a chamber temperature of 750° C., at three different chamber pressures of 12, 20 and 100 Torr, and at three different cleaning time periods of 0.25, 0.5 and 1 minute, respectively. The general trend of the effect of temperature, pressure, cleaning time, and flow rate ratio on the etch rate is observed. For instance, Tests #10, #11 and #15 indicate that at a constant chamber temperature of 750° C., a constant cleaning time of 1 minute, and a constant volume percent $NF_3$ of 0.005, the etch rate increases drastically as the chamber pressure is increased from 12 to 20 and then to 100 Torr. It should be noted that due to equipment limitations, data accuracy at very low etch rates is not as good as that at higher etch rates. Test data obtained at a constant chamber temperature of 750° C., a constant chamber pressure of 20 Torr, and a constant cleaning time of 1 minute (Tests #11, #12, #13 and #14) indicates that the etch rate is directly proportional to the volume percent of $NF_3$. A similar etch rate dependency on the volume percent of $NF_3$ is also observed in Tests #16, #17 and #18.

Test #19 was conducted at a temperature of 775° C., 100 Torr, 0.5 minute cleaning time and a volume percent $NF_3$ of 0.1. When compared to data obtained in Test #16, it is seen that the etch rates for the three films are improved due to the higher chamber temperature used, i.e. 775° C. vs. 750° C.

Table I clearly shows that a greatly improved and synergistic result is achieved by the present cleaning method when compared to that disclosed by the prior art method. By combining two unexpected and unique process conditions, i.e. a moisture-free chamber environment and a higher than prior-art chamber temperature, greatly improved etch rates are achieved at very low chamber pressures. The present improved cleaning method therefore enables one to effectively carry out a cold-wall CVD chamber cleaning process at a satisfactory etch rate while substantially eliminates health, safety, and environmental concerns.

Table II presents data obtained at various chamber temperatures, various chamber pressures, various cleaning time periods and various volume percentages for the cleaning gas chlorine trifluoride ($ClF_3$). The moisture content of the chamber in all tests is below 1 PPM.

Tests #21 and #22 indicate data obtained at 600° C. chamber temperature, 20 Torr chamber pressure and 7 vol % $ClF_3$, increasing the cleaning time from 1 minute to 3 minutes has no effect on etch rate for nitride films. This is probably attributed to the extreme low flow rate and the resulting low volume percent of $ClF_3$.

Data obtained in Tests #23~26 indicate that at a constant chamber temperature of 600° C., a constant chamber pressure of 20 Torr, and a constant cleaning time of 0.17 minute, increasing the volume percent $ClF_3$ increases the etch rates for all three films. It should also be noted that in comparing Test #25 with Test #1 in Table I, it is noted that the etch rate of $ClF_3$ is significantly higher than that of $NF_3$ even when the $ClF_3$ etching is conducted at a lower chamber temperature and for a shorter cleaning time period.

Tests #27 and #28 were conducted at a higher chamber temperature of 625° C. Comparing Test #27 with Test #23, it is seen that increasing chamber temperature by 25° C. has a positive effect on etch rates for all three films.

Tests #29 through #35 were conducted at a constant chamber temperature of 650° C. and at a constant chamber pressure of 20 Torr. When comparing data obtained in Test #29, #30, #31 and #32, it is noticed that volume percent $ClF_3$ has a more pronounced effect on the etch rates for all three films than that of the etch time period. For tests conducted at the same temperature, same pressure and same time period (Tests #33 through #35), the etch rates for all three films are directly proportional to the volume percent of $ClF_3$.

Figure 2:
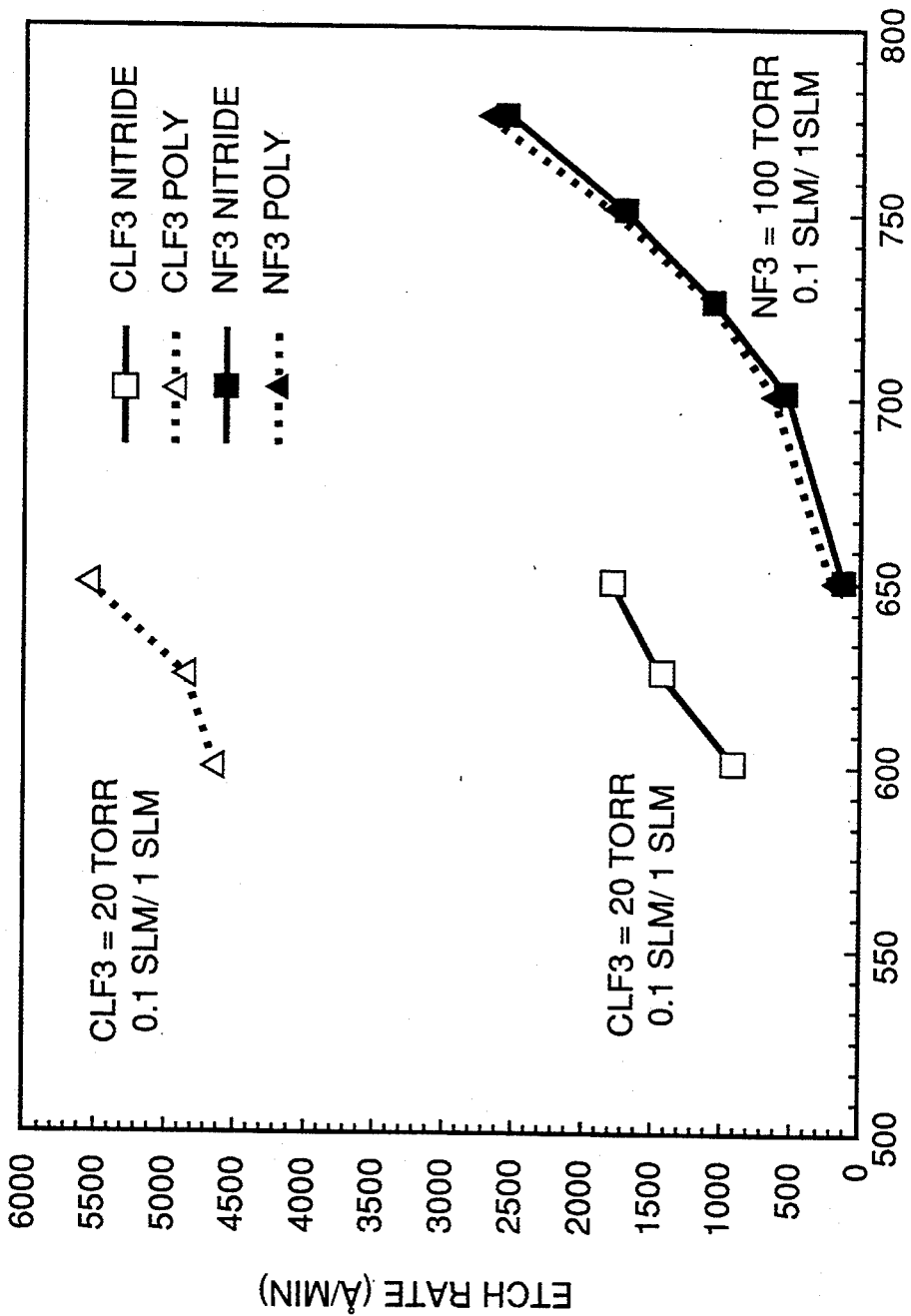
FIG. 2 is a graph showing etch rate as a function of etching temperatures for nitrogen trifluoride and chlorine trifluoride.

Test data obtained by using etchant gases of $NF_3$ and $ClF_3$ are also presented in FIG. 2. It is seen that at least for silicon nitride and polysilicon films, $ClF_3$ is more efficient as an etchant gas than $NF_3$. It is also noted that the etch rate of $ClF_3$ on polysilicon films is extremely high. This is an advantage made possible by the present

TABLE II

| Test # | T (°C.) | P (Torr) | Time (Min) | Flow Rate (sccm) $Cl_3/N_2$ | Vol % $ClF_3$ | Etch Rate (Å/Min) Nitride | Oxide | Poly |
|---|---|---|---|---|---|---|---|---|
| 20 | 550 | 20 | 1 | 50/750 | 7 | 195 | — | — |
| 21 | 600 | 20 | 1 | 50/750 | 7 | 455 | — | — |
| 22 | 600 | 20 | 3 | 50/750 | 7 | 420 | — | — |
| 23 | 600 | 20 | .17 | 100/10,000 | 1 | 678 | 270 | 1836 |
| 24 | 600 | 20 | .17 | 100/5,000 | 2 | 1038 | 444 | — |
| 25 | 600 | 20 | .17 | 100/1,000 | 10 | 1500 | 594 | — |
| 26 | 600 | 20 | .17 | 200/1,000 | 20 | 1950 | 1464 | 11,430 |
| 27 | 625 | 20 | .17 | 100/10,000 | 1 | 1038 | 588 | 1866 |
| 28 | 625 | 20 | .17 | 100/1,000 | 10 | 1482 | 978 | 4164 |
| 29 | 650 | 20 | 3 | 50/750 | 7 | 425 | — | — |
| 30 | 650 | 20 | 3 | 100/750 | 14 | 474 | — | — |
| 31 | 650 | 20 | 1 | 100/1,000 | 10 | 1929 | — | — |
| 32 | 650 | 20 | .25 | 100/1,000 | 10 | 1960 | 1700 | 6908 |
| 33 | 650 | 20 | .17 | 100/10,000 | 1 | 1536 | 900 | 4314 |
| 34 | 650 | 20 | .17 | 100/5,000 | 2 | — | 1776 | — |
| 35 | 650 | 20 | .17 | 100/1,000 | 10 | 3030 | 1974 | — |

It was discovered that etchant gas $ClF_3$ can be used at a lower chamber temperature and at a lower chamber pressure than that used for $NF_3$. For instance, Test #20 indicates that even at a low chamber temperature of 550° C. and a low chamber pressure of 20 Torr, nitride films can be etched at 7 vol % $ClF_3$. Overall, $ClF_3$ has a high selectivity of polysilicon films over nitride films. It should be noted that the present improved cleaning process also works at chamber temperatures below 550° C., even though temperatures above 550° C. are more preferred. A chamber pressure between 5 to 50 Torr can be suitable used.

invention in that it affords $ClF_3$ a high selectivity between polysilicon films and silicon nitride films.

It should be noted that FIG. 2 indicates that the effective etching temperature and pressure of $ClF_3$ i.e. 600°~650° C. and 20~100 Torr coincide with the normal deposition temperature and pressure for polysilicon. This presents another processing advantage made possible by the present invention in that in-situ cleaning can be effectively carried out at the same chamber temperature and the same chamber pressure used for deposition without the necessity of making any changes. This saves a significant amount of downtime normally required for in-situ cleaning where the chamber temperature must be changed from a deposition temperature to a cleaning temperature.

For NF$_3$, FIG. 2 indicates that etch rates for both silicon nitride films and polysilicon films are essentially the same. Furthermore, the etching temperature and pressure required for silicon nitride film, i.e. about 700°~750° C. and about 20~100 Torr are approximately the same for the deposition process of such films. This further presents a processing advantage made possible by the present invention in that the chamber temperature can remain constant for both the deposition process and the cleaning process of silicon nitride films.

While specific data on etchant gases of sulfur hexafluoride and carbon tetrafluoride is not presented, these gases have been used successfully in the etching of various films of semiconductor materials in a wide temperature and pressure range. Similar to NF$_3$ and ClF$_3$, sulfur hexafluoride and carbon tetrafluoride also disassociate at higher temperatures to produce free fluorine to etch. It has been found that the etch rates achieved by using SF$_6$ and CF$_4$ are lower than those achieved by using NF$_3$ or ClF$_3$ at the same etch temperature.

It should be emphasized that the present improved CVD chamber cleaning method enables one to customize an etchant gas chemistry and parameters to the specific deposition conditions of a semiconductor film. This includes applications in which reactive gases are mixed together in order to customize the etching temperature and pressure to a specific semiconductor film material and thus reduces or eliminates downtime for cleaning.

The novel CVD chamber cleaning method has been demonstrated as an effective and advantageous process for cleaning various semiconductor films, i.e. films of silicon nitride, polysilicon, silicon oxide and epitaxial silicon from a cold-wall CVD chamber. Examples of other semiconductor films that can be cleaned by the present method include titanium, tungsten, titanium silicide, tungsten silicide or the like.

While the present invention has been described in an illustrative manner, it should be understood that the terminology used is intended to be in a nature of words of description rather than of limitation.

Furthermore, while the present invention has been described in terms of several preferred embodiments thereof, it is to be appreciated that those skilled in the art will readily apply these teachings to other possible variations of the invention. For instance, etchant gases other than nitrogen trifluoride, chlorine trifluoride, sulfur hexafluoride and carbon tetrafluoride can be used which are equally effective in achieving the desirable result of the present invention.

The embodiments of the invention in which an exclusive property or privilege is claimed are defined as follows:

We claim:

1. A method of cleaning a deposited film on the chamber wall in a chemical vapor deposition chamber at a chamber pressure and a chamber temperature comprising the steps of evacuating said chamber to a moisture content of less than 10 parts per million by volume and applying at least one reactive gas selected from the group consisting of nitrogen trifluoride, chlorine trifluoride, sulfur hexafluoride and carbon tetrafluoride to said deposited film.

2. A method according to claim 1 wherein said deposited film is formed of a material selected from the group consisting of silicon nitride, silicon oxide, polysilicon, epitaxial silicon, titanium, tungsten, titanium silicide and tungsten silicide.

3. A method according to claim 1 wherein said chamber temperature is at least 550° C.

4. A method according to claim 1 wherein said chamber temperature is preferably no more than 775° C.

5. A method according to claim 1 wherein said chamber pressure is less than 150 Torr.

6. A method according to claim 1 wherein said at least one reactive gas is nitrogen trifluoride.

7. A method according to claim 1 wherein said at least one reactive gas is chlorine trifluoride.

8. A method according to claim 1 wherein said at least one reactive gas is sulfur hexafluoride.

9. A method according to claim 1 wherein said at least one reactive gas is carbon tetrafluoride.

10. A method according to claim 1 wherein said at least one reactive gas is nitrogen trifluoride applied at a chamber temperature in the range between 650° to 775° C., a chamber pressure in the range between 12 to 100 Torr, and a chamber water content of less than 2 PPM by volume.

11. A method according to claim 1 wherein said at least one reactive gas is chlorine trifluoride applied at a chamber temperature in the range between 550° to 650° C., a chamber pressure in the range between 5 to 50 Torr, and a chamber water content of less than 2 PPM by volume.

12. A method according to claim 1 wherein said chemical vapor deposition chamber is a cold-wall CVD chamber.

13. A method of cleaning a deposited film from a substantially moisture-free chemical vapor deposition chamber comprising the steps of:
    evacuating said chamber to a moisture content of less than 10 parts per million by volume,
    heating said chamber to a temperature of at least 550° C.,
    filling said chamber to a pressure of less than 150 Torr by a mixture of gases containing at least one reactive gas and at least one inert gas, said at least one reactive gas being selected from the group consisting of nitrogen trifluoride, chlorine trifluoride, sulfur hexafluoride and carbon tetrafluoride, and
    contacting said deposited film with said mixture of gases for a period of time sufficient to clean the deposited film from said chamber.

14. A method according to claim 13 wherein the volume percent of said at least one reactive gas in said mixture of gases is at least 0.1.

15. A method according to claim 13 wherein said deposited film is formed of a material selected from the group consisting of silicon nitride, silicon oxide, polysilicon, epitaxial silicon, titanium, tungsten, titanium silicide and tungsten silicide.

16. A method according to claim 13 wherein said substantially moisture-free chamber has a water content of less than 10 PPM by volume.

17. A method according to claim 13 wherein said period of time sufficient to clean the deposited film from said chamber is less than or equal to 4 minutes.

18. A method according to claim 13 wherein said at least one reactive gas is nitrogen trifluoride applied at a chamber temperature in the range between 650° to 775° C., a chamber pressure in the range between 12 to 100 Torr, and a chamber water content of less than 2 PPM by volume.

19. A method according to claim 13 wherein said at least one reactive gas is chlorine trifluoride applied at a chamber temperature in the range between 550° to 650° C., a chamber pressure in the range between 5 to 50 Torr, and a chamber water content of less than 2 PPM by volume.

20. A method according to claim 13 wherein said at least one reactive gas is sulfur hexafluoride applied at a chamber water content of less than 2 PPM by volume.

21. A method according to claim 13 wherein said at least one reactive gas is carbon tetrafluoride applied at a chamber water content of less than 2 PPM by volume.

22. A method according to claim 13 wherein said chemical vapor deposition chamber is a cold-wall CVD chamber.

* * * * *